United States Patent
Wu (10) Patent No.: US 6,420,232 B1
(45) Date of Patent: Jul. 16, 2002

(54) METHODS OF FABRICATING A SCALABLE SPLIT-GATE FLASH MEMORY DEVICE HAVING EMBEDDED TRIPLE-SIDES ERASE CATHODES

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 09/710,866

(22) Filed: Nov. 14, 2000

(51) Int. Cl.$^7$ ............................................. H01L 21/336
(52) U.S. Cl. ..................... 438/257; 438/267; 257/298
(58) Field of Search ................................. 438/257, 267, 438/424

(56) References Cited

U.S. PATENT DOCUMENTS

| | | | | |
|---|---|---|---|---|
| 6,204,126 B1 | * | 3/2001 | Hsieh et al. | 438/267 |
| 2001/0012662 A1 | * | 8/2001 | Hsieh et al. | 438/257 |
| 2001/0022375 A1 | * | 9/2001 | Hsieh et al. | 257/298 |
| 2001/0028578 A1 | * | 10/2001 | Cunningham et al. | 365/185.28 |

* cited by examiner

Primary Examiner—Chandra Chaudhari
Assistant Examiner—David S Blum
(74) Attorney, Agent, or Firm—Pepper Hamilton LLP; James M. Singer, Esq.

(57) ABSTRACT

A high-density, high-speed, low-power, scalable split-gate memory device and its fabrication are disclosed. The channel length of a control-gate device and the channel length of a floating-gate device in a split-gate flash memory device can be tailored separately to have a dimension much smaller than the minimum feature size of technology used. A sidewall erase cathode using a thin polycrystalline-silicon layer as the floating gate may be implemented. The sidewall erase cathode may be implemented on two advanced high-density isolation structures having embedded double-sides erase cathodes and high coupling ratio to form triple-sides erase cathodes, which provide high-efficiency, self-limiting erasing from the floating gate to the control gate. Moreover, self-aligned silicidation is applied to the control gate, the source/common buried source, and the drain of the device to reduce contact and interconnect resistances. Self-aligned contacts are formed by using silicon-nitride spacers on the sidewalls to reduce the space of contacts.

30 Claims, 7 Drawing Sheets

METHODS OF FABRICATING A SCALABLE SPLIT-GATE FLASH MEMORY DEVICE HAVING EMBEDDED TRIPLE-SIDES ERASE CATHODES

BACKGROUND OF THE INVENTION

1. Field of the Invention

The invention relates generally to flash memory devices and more particularly to very high-density, high-speed and low-power split-gate flash memory devices.

2. Description of Related Art

The flash memory devices are known to store charges in an isolated gate (known as the floating gate) by means of either, Fowler-Nordheim tunneling or hot-carrier injection through a thin insulator layer from the semiconductor substrate and to remove or erase charges stored in an isolated gate by means of Fowler-Nordheim tunneling through a thin insulator layer to the semiconductor substrate or the control gate. Basically, the cell size must be scaled down for high-density mass storage applications and the device structure must be developed toward low-voltage, low-current and high-speed operation with high endurance and high retention.

Figure 1:
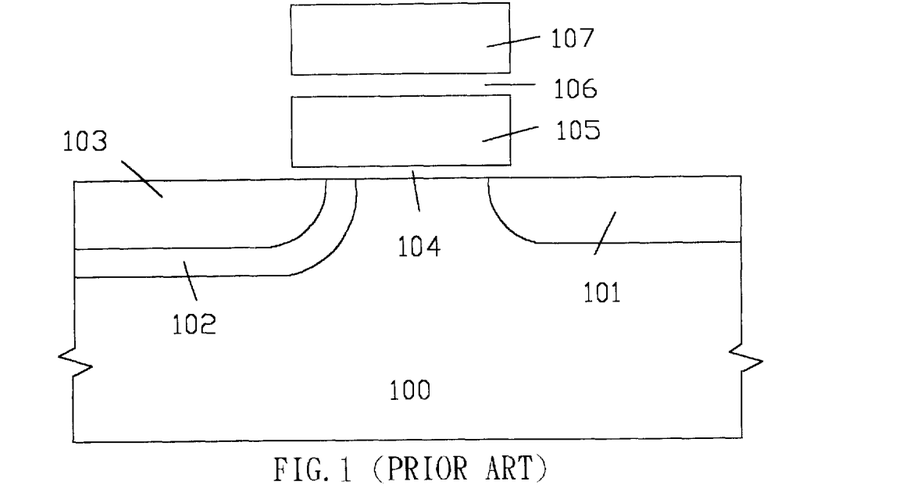
FIG. 1 shows a partial cross-sectional view of a conventional stack-gate flash memory device.
Figure 2:
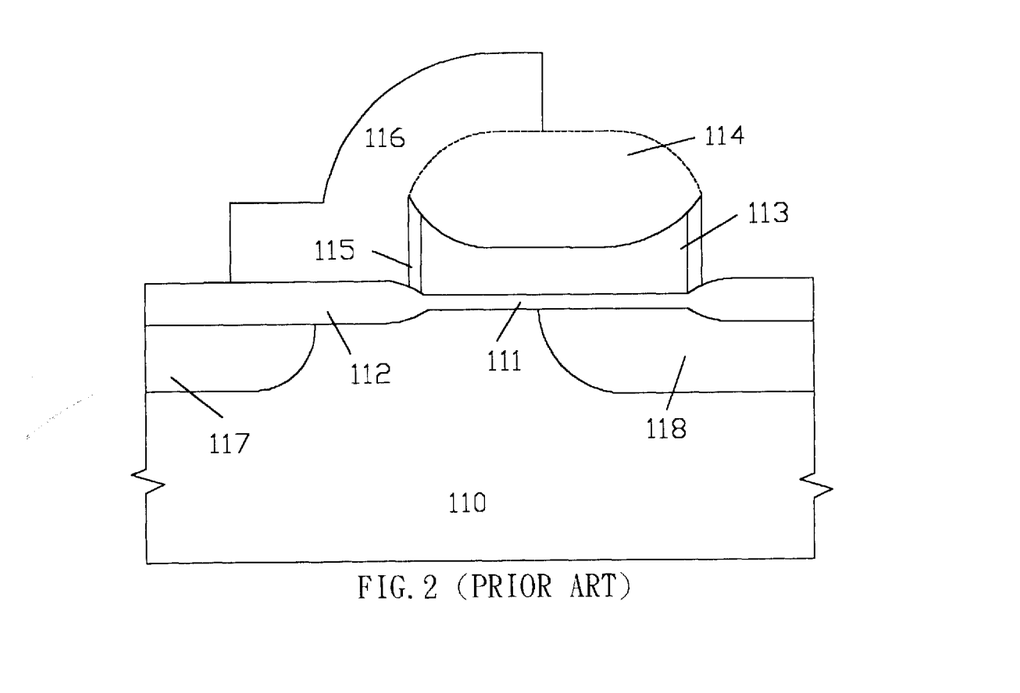
FIG. 2 shows a partial cross-sectional view of a conventional split-gate flash memory device.

Based on the device structure, the prior arts can be basically divided into two categories: stack-gate structure and split-gate structure. A typical stack-gate structure of conventional flash memory device is shown in FIG. 1, where the device gate length is mainly limited by the minimum feature size of technology used and the device is recognized to be a one-transistor device; a typical split-gate structure of conventional flash memory device is shown in FIG. 2, where the device gate length including the floating-gate length and the control-gate length is recognized to be a 1.5 transistor device. The stack-gate flash memory device shown in FIG. 1 includes a p-type substrate 100, an n$^+$-type source diffusion region 101 and an n$^+$-type drain diffusion region 103 inserted in an n-type drain diffusion region 102. A thin tunneling-oxide layer 104 is provided on the surface of a p-type substrate 100 having a thickness of approximately 100 Angstroms. A polycrystalline-silicon layer 105 acted as the floating gate is provided on a thin tunneling-oxide layer 104, and an inter-gate dielectric layer 106 using the ONO structure separates the floating gate 105 and the control gate 107 using the polycide layer.

The programming of the stack-gate flash memory device shown in FIG. 1 is accomplished by applying a relatively high positive voltage to the control gate and a moderately high positive voltage to the source of the device, and the drain is grounded. The device is operated in saturation region and the high lateral electric field across the channel-modulation region near the source is used to generate hot carriers in which hot electrons with energy higher than the interface barrier (~3.15 eV) between the conduction bands of the thin tunneling-oxide layer and the semiconductor substrate are injected into the floating gate and stored there, and the hot holes generated produce the substrate current. Since most of channel carriers are collected by the positive source voltage, the injection efficiency is poor and most of the drain current is wasted. Moreover, the programming power is large, resulting in a further difficulty for high-density mass storage applications.

The erasing of the stack-gate flash memory device shown in FIG. 1 is accomplished by applying a relatively high positive voltage to the drain while the control gate is grounded and the source is usually floating. The stored electrons in the floating gate are tunneling from the floating gate to the drain by high electric field across the thin tunneling-oxide layer over the double-diffused drain. The above erasing is slightly modified by reducing the applied voltage across the drain and substrate junction while the control gate is applied with a moderately high negative voltage. The reduction of the drain voltage is mainly used to eliminate the band-to-band tunneling effects which may produce hot-hole injection or holes trapped in the gate oxide. Apparently, a deeper double-diffused drain junction is needed to have a larger overlapping area for the thin tunneling-oxide layer and further to eliminate the band-to-band tunneling effects, resulting in lower read speed due to larger gate-drain overlapping capacitance and drain-substrate junction capacitance and a further difficulty for device scaling. Moreover, the erase of stored electrons from the floating gate to the overlapped drain is not self-limiting, resulting in the over-erase problem which needs complicated circuitry and software to perform a series of erase and verify steps.

A typical split-gate flash memory device shown in FIG. 2 includes a p-type substrate 110 and n$^+$-type source and drain diffusion regions 118, 117 provided in the p-type substrate 110. A thin tunneling-oxide layer 111 is formed on the surface of a portion of the p-type substrate 110 and a portion of the n$^+$-type source diffusion region 118 under the polycrystalline-silicon floating-gate 113. The floating gate 113 overlaps a portion of the source diffusion region 118 and a portion of the channel. A special shape of polycrystalline-silicon oxide 114 is formed on the polycrystalline-silicon floating-gate 113 using the conventional LOCal-Oxidation of Silicon (LOCOS) technique. A dielectric layer 115 separates the sidewall of the polycrystalline-silicon floating-gate 113 from the control gate 116, and a portion of the control gate 116 is formed on a thicker gate-oxide layer 112. The control gate 116 overlaps a portion of the drain diffusion region 117 and a portion of the channel through a thicker gate-oxide layer 112. Apparently, the limitation of lithographic alignment tolerance of the control gate results in a barrier for further device scaling besides the natural limitation due to 1.5 transistor based on the lithographic point of view. Therefore, the prior art shown in FIG. 2 is not suitable for high-density mass-storage applications if the cost per bit is concerned. Moreover, a large source-substrate junction capacitance becomes a major limitation for high-speed read operation.

The programming of the conventional split-gate flash memory device shown in FIG. 2 is accomplished by applying a relatively low positive voltage (threshold voltage of the control-gate transistor) and a relatively high positive voltage to the source of the device, and the drain is grounded. The hot carriers are generated by high lateral electric field under the gap between the floating gate and the control gate. The generated hot-electrons with energy higher than the interface barrier (~3.15 eV) between the conduction bands of the thin gate-oxide and the p-type substrate are injected into the floating gate and stored there, and the hot-holes generated produce the substrate current. Apparently, much larger source voltage is needed because a portion of applied source voltage is dropped across the channel formed under the control gate and the channel under the floating gate, as compared to that of the stack-gate flash memory device. However, the channel current for programming which is controlled by the control gate is much smaller than that of the stack-gate flash memory device shown in FIG. 1 and this is one of the advantages of the split-gate flash memory device.

The erasing of the conventional split-gate flash memory device shown in FIG. 2 is accomplished by applying a relatively high positive voltage to the control gate while the source and the drain are grounded. The erasing is performed by using Fowler-Nordheim tunneling from the floating gate to the control gate through the sidewall injector along the edge of the floating gate and is self-limiting through the accumulation of positive charges on the injector of the floating gate. Therefore, the over-erase problem doesn't occur for the split-gate flash memory device shown in FIG. 2, the erasing circuitry is then much simpler than that of the stack-gate flash memory device shown in FIG. 1. However, the smiling effect due to the oxidation of the sidewall of the polycrystalline-silicon floating gate may produce the reverse tunneling disturbs. Therefore, a thicker polycrystalline-silicon oxide grown on the sidewall of the polycrystalline-silicon floating gate to reduce the reverse tunneling disturbs may simultaneously reduce the tunneling probability of the sidewall injector, and hence higher applied voltage to the control gate is inevitable.

From the above description, the stack-gate structure can be scaled by using the minimum feature size of technology used, but the programming efficiency is poor and most of drain current is wasted, and the over-erase problem needs complicated circuitry. Moreover, the scaling of the channel length of the stack-gate structure is further limited by the overlapping length of the double-diffused drain and the floating gate for efficient erasing without inducing the band-to-band tunneling effects. The split-gate structure exhibits larger cell size and cannot be easily scaled by using the prior art, and higher applied voltages are needed for program and erase, but the programming efficiency is high and the drain current for programming is smaller, and the erasing is self-limiting and complicated circuitry is not required.

It is, therefore, an objective of this invention to provide a scalable split-gate flash memory device for high-density, high-speed and low-power mass storage applications to overcome the disadvantages of the conventional split-gate flash memory device.

SUMMARY OF THE INVENTION

The invention discloses a method for fabricating a scalable split-gate flash memory device on an isolated structure of either modified LOCOS technique or shallow-trench-isolation (STI) technique. The scalable split-gate flash memory device is fabricated by the spacer formation technique without the conventional lithographic limitation, in which the floating-gate transistor and the control-gate transistor can be separately tailored to have a channel length much smaller than the minimum feature size of technology used. Therefore, the overall channel-length of the fabricated split-gate flash memory device can be smaller than the minimum feature size of technology used and is mainly determined by the composite widths of the polycrystalline-silicon spacers. A sidewall erase cathode using a thin polycrystalline-silicon layer as the floating gate is implemented accordingly without extra process. The scalable split-gate flash memory device having a sidewall erase cathode is implemented on two advanced high-density isolation structures having embedded double-sides erase cathodes and high coupling ratio to form the triple-sides erase cathodes which are capable for high-efficiency erasing from the floating gate to the control gate in a self-limiting manner. Moreover, the self-aligned silicidation is performed to the control gate, the source/common buried source and the drain of scalable split-gate flash memory device to reduce the contact and interconnect resistances, and the self-aligned contacts are performed by using the silicon-nitride spacers on the sidewalls of devices to reduce the space of the contacts. As a consequence, the present invention is feasible to fabricate high-density, high-speed and low-power split-gate flash memory array for mass-storage applications.

DETAILED DESCRIPTION OF THE PREFERRED EMBODIMENTS

Figure 3:
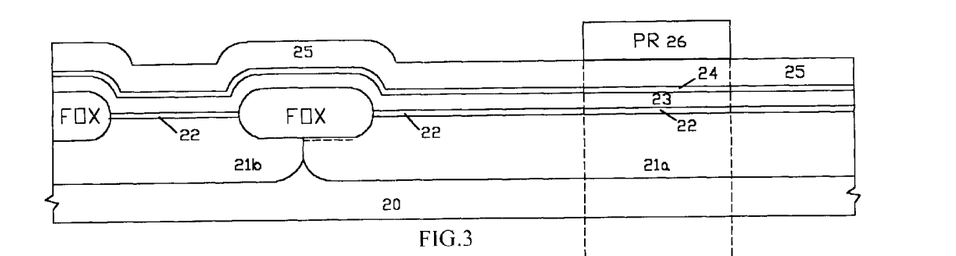
FIGS. 3 through 15 show the schematic cross-sectional views of the process and the structure of the present invention for simultaneously fabricating scalable split-gate flash memory devices and peripheral CMOS devices.

Referring now to FIG. 3 through FIG. 15 there is shown a first embodiment of the present invention. A first thermal silicon-oxide layer 22 is thermally grown on the p-well 21a formed in the p-doped (100) monocrystalline-silicon substrate 20 to have a thickness of between about 85 to 110 Angstroms at 850° C. in a dry oxygen ambient. A first polycrystalline-silicon layer 23 of between about 300 to 600 Angstroms in thickness is deposited by low-pressure chemical-vapor-deposition (LPCVD) at a temperature of between about 550° C. to 630° C. using silane as the silicon source. A first dielectric layer 24 of the equivalent silicon-oxide thickness of between about 150 to 220 Angstroms is formed on the first polycrystalline-silicon layer 23. The first dielectric layer 24 can be a composite ONO layer consisting of silicon oxide-silicon nitride-silicon oxide or a thermal polycrystalline-silicon oxide (poly-oxide) layer grown on the first polycrystalline-silicon layer 23. The composite ONO layer is formed by first thermally growing a polycrystalline-silicon oxide layer, then depositing a LPCVD silicon-nitride layer and oxidizing the LPCVD silicon-nitride layer. A first masking silicon-nitride layer 25 of between about 1000 to 2000 Angstroms is deposited on the first dielectric layer 24 by LPCVD at a temperature of 720° C. using dichlorosilane and ammonia as the source of silicon and nitrogen. The conventional photolithographic technique is used to define the virtual channel length of flash memory devices as shown in FIG. 3, where the virtual channel length is equal to two device-gate lengths plus one common-source diffusion width. The patterned photoresist 26 is used as a mask to anisotropically etch the first masking silicon-nitride layer 25, the first dielectric layer 24 and the first polycrystalline-silicon layer 23, and the masking photoresist 26 is then removed. Note that this etching process completely removes the stack structure consisting of the first masking silicon-nitride layer 25/the first dielectric layer 24/the first polycrystalline-silicon layer 23 over the semiconductor regions designated for fabricating other semiconductor devices, especially CMOS devices.

Figure 4:
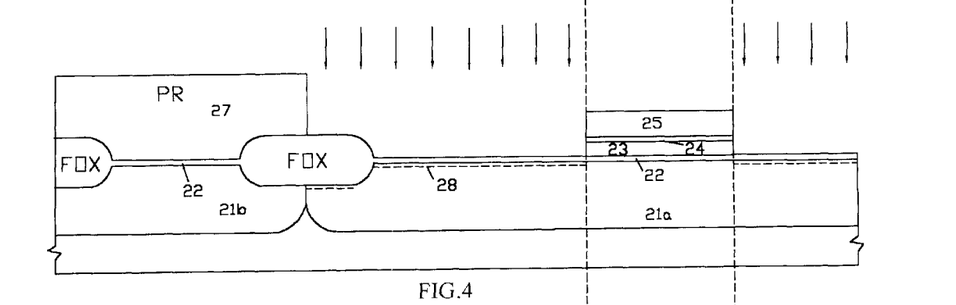
Figure 5:
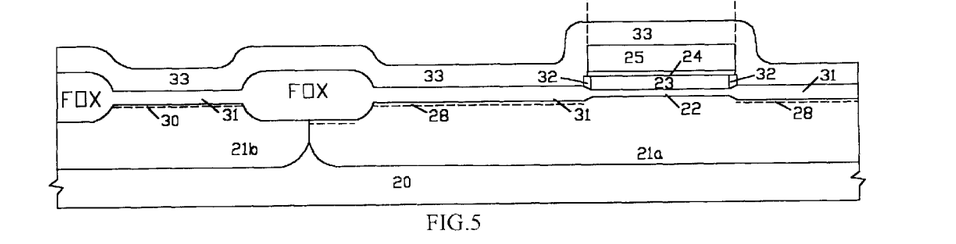
Figure 6:
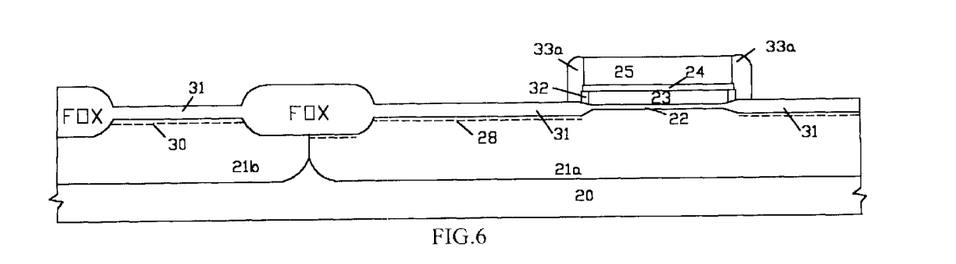
Figure 7:
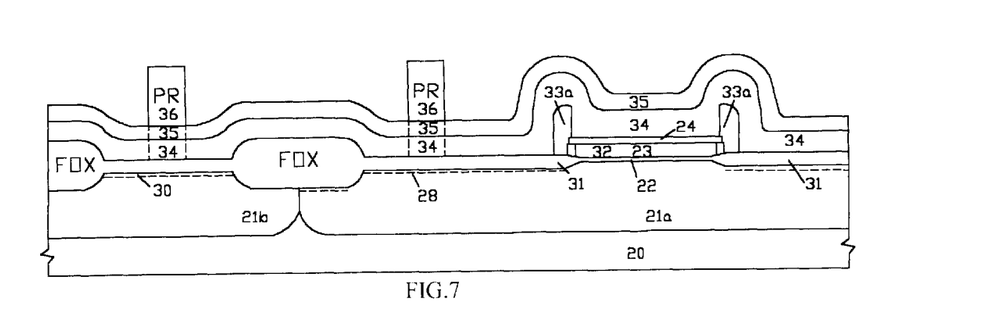
Figure 8:
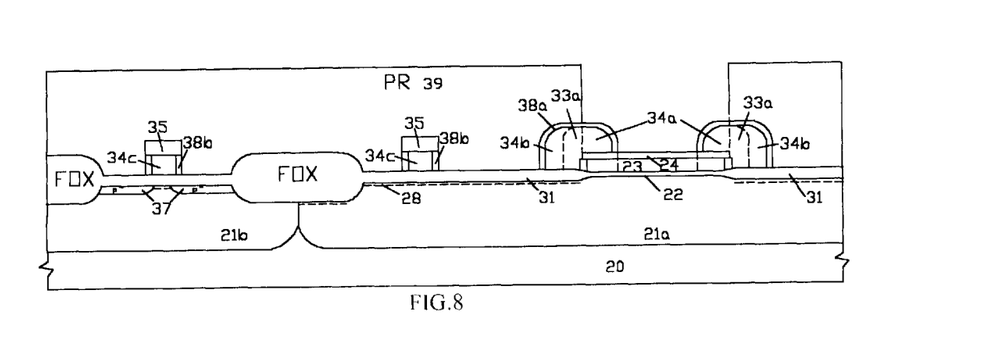

Using the masking photoresist 27 to mask all p-channel MOS devices in the n-wells 21b, the implants of acceptor impurities 28 across the first thermal silicon-oxide layer 22 into the semiconductor regions of the p-wells are performed to adjust the threshold-voltage and the punch-through voltage of all n-channel MOS devices and all control-gate devices of flash memory devices, as shown in FIG. 4, and the masking photoresist 27 is stripped. Using the reverse-tone masking photoresist 29, the implants of acceptor and donor impurities 30 across the first thermal silicon-oxide layer 22 into the semiconductor regions of the n-wells are performed to adjust the threshold voltage and the punch-through voltage of all p-channel MOS devices, as shown in FIG. 5. Stripping the reverse-tone masking photoresist 29, the oxidation of the sidewalls of the first polycrystalline-silicon layer 23 and the surface of the monocrystalline-silicon substrate 20 is performed in a dry oxygen ambient at a temperature of between about 850° C. to 1000° C. to have a second thermal silicon-oxide layer 31 of between about 200 to 400 Angstroms in thickness over the monocrystalline-silicon substrate 20 and a first thermal poly-oxide layer 32 of between about 100 to 250 Angstroms in thickness on the sidewalls of the first polycrystalline-silicon layer 23. The oxidized first polycrystalline-silicon layer 23 becomes the sidewall erase cathode of flash memory devices and the first thermal poly-oxide layer 32 becomes the tunneling-oxide layer of flash memory devices. A first conformable polycrystalline-silicon layer 33 of between about 500 to 1500 Angstroms in thickness is deposited by LPCVD using silane decomposition at a temperature of between about 580° C. to 650° C., as shown in FIG. 5. The deposited first conformable polycrystalline-silicon layer 33 is in-situ doped with phosphorous impurities and the doping concentration is between about $10^{18}$ to $5\times10^{19}$ Atoms/cm$^3$, and is then anisotropically etched to form the first polycrystalline-silicon spacers 33a, as shown in FIG. 6. The first masking silicon-nitride layer 25 is etched by a wet-chemical solution using hot phosphoric acid. Again, a second conformable polycrystalline-silicon layer 34 of between about 500 to 2000 Angstroms in thickness is deposited by LPCVD using silane decomposition at a temperature of between about 580° C. to 650° C. and is in-situ doped with phosphorous impurities having a concentration of between about $10^{18}$ and $5\times10^{19}$ Atoms/cm$^3$. A second masking silicon-nitride layer 35 of between about 500 to 1000 Angstroms in thickness is then deposited by LPCVD using dichlorosilane and ammonia reaction at 720° C. The ion-implantation of phosphorous impurities is performed across the second masking silicon-nitride layer to dope the second conformable polycrystalline-silicon layer 34 and the dose is between about $10^{15}$ to $5\times10^{15}$ Atoms/cm$^2$. The masking photoresist 36 is patterned to define the gate lengths of n- and p-channel MOS devices, as shown in FIG. 7, followed by etching the second masking silicon-nitride layer 35 using dry etching and then anisotropically etching the second polycrystalline-silicon layer 34 to form the second polycrystalline-silicon spacers 34a and 34b on both sides of the first polycrystalline-silicon spacer 33a and the first polycrystalline-silicon gates 34c of n- and p-channel MOS devices, as shown in FIG. 8. Note that the widths of the polycrystalline-silicon spacers 34a and 34b are mainly controlled by the thickness of the deposited conformable polycrystalline-silicon layer 34. Therefore, the channel length of the floating-gate devices and the channel length of the control-gate devices are scalable through the thickness control of the deposited conformable polycrystalline-silicon layer.

Figure 9:
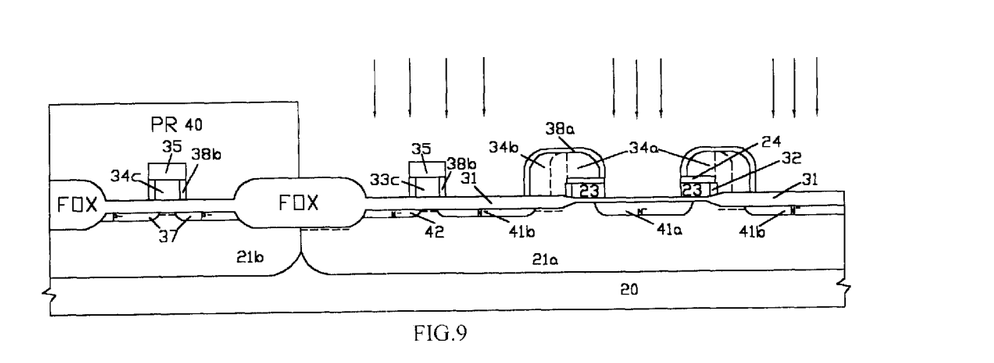

The self-aligned implant of boron impurities for the lightly-doped source and drain 37 of p-channel MOS devices is performed through the second thermal silicon-oxide layer 31 by using the masking photoresist (not shown in the figure) and the dose is between about $10^{13}$ to $10^{14}$ Atoms/cm$^2$, and the masking photoresist is stripped. The oxidation of the exposed polycrystalline-silicon spacers 34a and 34b and the sidewalls of the first polycrystalline-gate 34c of n- and p-channel MOS devices is performed in a dry oxygen or steam ambient at a temperature of between about 900° C. to 1050° C. to form the poly-oxide layer 38a and 38b having a thickness of between about 200 to 300 Angstroms. The first dielectric layer 24 and the first polycrystalline-silicon layer 23 are sequentially etched by reactive-ion etching with a non-critical masking photoresist 39, as shown in FIG. 8. Using the masking photoresist 40, the implant of phosphorous impurities for the lightly-doped source 41a and drain 41b of flash memory devices and the lightly-doped source and drain 42 of n-channel MOS devices is performed, as shown in FIG. 9, and the dose of the lightly-doped implant is between about $10^{13}$ to $10^{14}$ Atoms/cm$^2$. After stripping the masking photoresist 40, the second masking silicon-nitride layer 35 on the first polycrystalline-silicon gate 34c of n-and p-channel MOS devices is removed by dry etch followed by oxidizing the exposed first polycrystalline-silicon gate 34c to form the poly-oxide layer 43a and the sidewalls of the etched first polycrystalline-silicon layer 23 to form the poly-oxide layer 43b. The poly-oxide layers 43a and 43b formed are grown in a dry oxygen ambient at a temperature of between about 850° C. to 1050° C. and the thickness of the poly-oxide layer is grown to have a thickness of between about 100 to 150 Angstroms.

Figure 10:
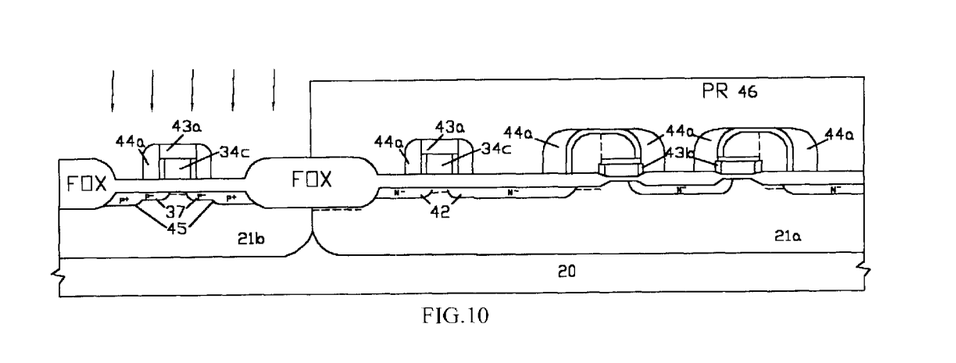

A first conformable silicon-nitride layer 44 is deposited by LPCVD using tetraethoxysilane and ammonia reaction at 750° C. and is anisotropically etched to form the first silicon-nitride spacers 44a for flash memory devices and n- and p-channel MOS devices. The thickness of the deposited first conformable silicon-nitride layer 44 is between about 500 to 1000 Angstroms. The implant of boron impurities for the heavily-doped source and drain diffusion regions 45 of p-channel MOS devices is performed by using the masking photoresist 46, as shown in FIG. 10, and the dose of the heavily-doped implant is between about $10^{15}$ to $5\times10^{15}$ Atoms/cm$^2$.

Figure 11:
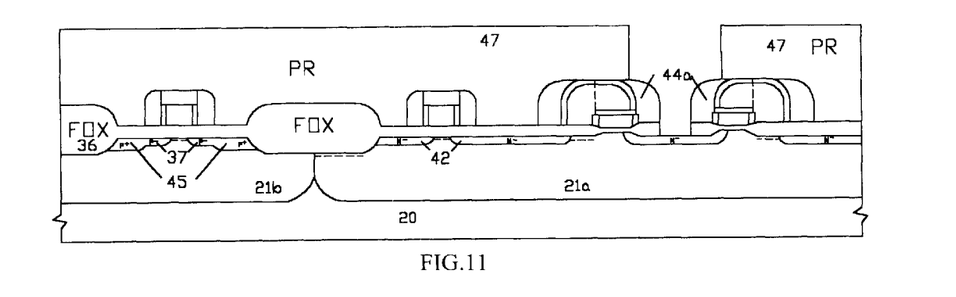
Figure 12:
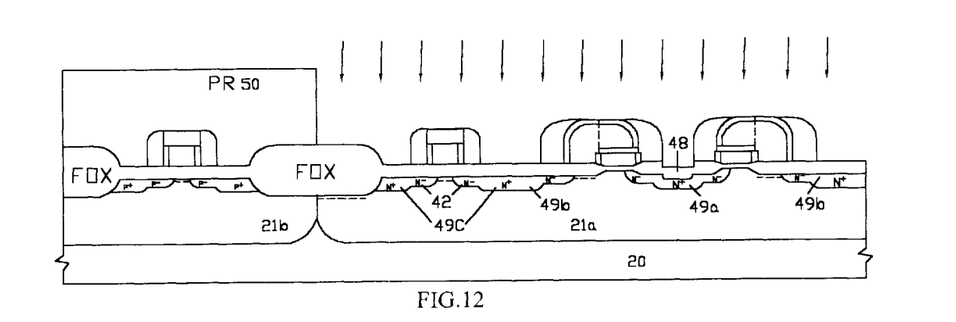

Using the masking photoresist 47, the field-oxide layer and the thermal silicon-oxide layer over the lightly-doped source of flash memory devices are removed by buffered hydrofluoric acid in a self-aligned manner, as shown in FIG. 11. After stripping the masking photoresist 47, the oxidation of the exposed semiconductor regions designated as the buried common source is performed in a dry oxygen ambient at a temperature of between about 850° C. to 1050° C. to have a thermal silicon-oxide layer 48 of between about 100 to 150 Angstroms in thickness. The implant of arsenic impurities for the heavily-doped source 49a and drain 49b of flash memory devices and the heavily-doped source and drain 49c of n-channel MOS devices is performed by using the masking photoresist 50, as shown in FIG. 12, and the dose of the heavily-doped implant is between about $10^{15}$ to $5\times10^{15}$ Atoms/cm$^2$. After stripping the masking photoresist 50, a thermal cycle used to activate the implanted impurities and to eliminate the implant-induced defects is performed in a nitrogen ambient using furnace or rapid-thermal-anneal (RTA) system and the annealing temperature is between about 900° C. to 1000° C. The silicon-oxide layers over the heavily-doped source and drain regions and the poly-oxide layers over the third polycrystalline-silicon gates of flash memory devices and n-and p-channel MOS devices are removed by a wet-chemical dip in dilute hydrofluoric acid or buffered hydrofluoric acid or by anisotropic dry etching.

Figure 13:
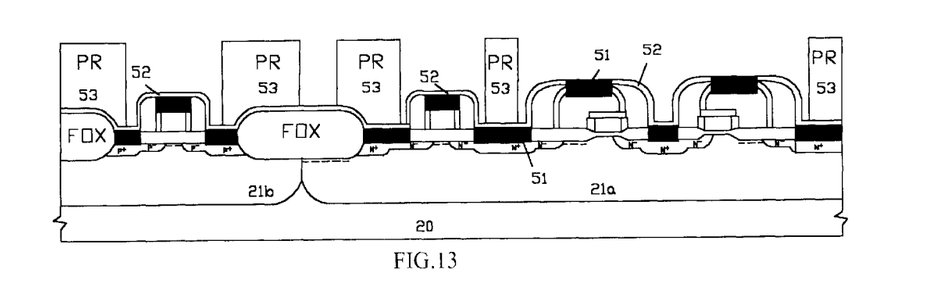
Figure 14:
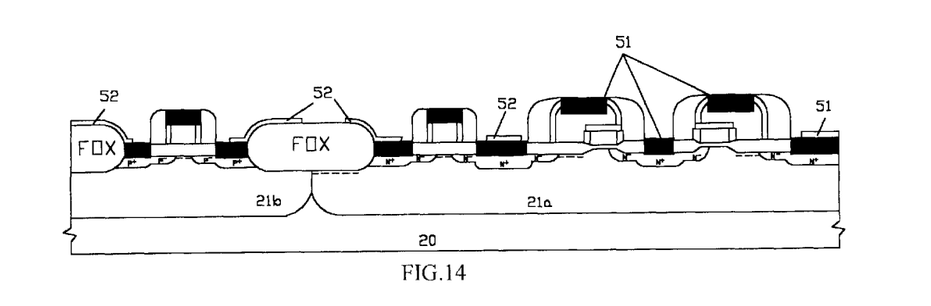

The titanium metal film is deposited by sputtering and the thickness is between about 500 to 1000 Angstroms. The rapid thermal annealing at 600° C. is performed in a nitrogen ambient to form the titanium-disilicide (TiSi$_2$) layer 51 over monocrystalline-and polycrystalline-silicon surfaces and the titanium-nitride (TiN) layer 52 over all surfaces, as shown in FIG. 13. Using the masking photoresist 53, the titanium-nitride layer 52 is patterned and etched by a NH$_4$OH:H$_2$O$_2$:H$_2$O (1:1:5) solution to form the contact areas for different metal interconnection, and the masking photoresist 53 is then stripped. The completed structure is heated in a furnace with argon ambient to reduce the resistivities of the titanium-nitride and titanium-disilicide layers, as shown in FIG. 14.

Figure 15:
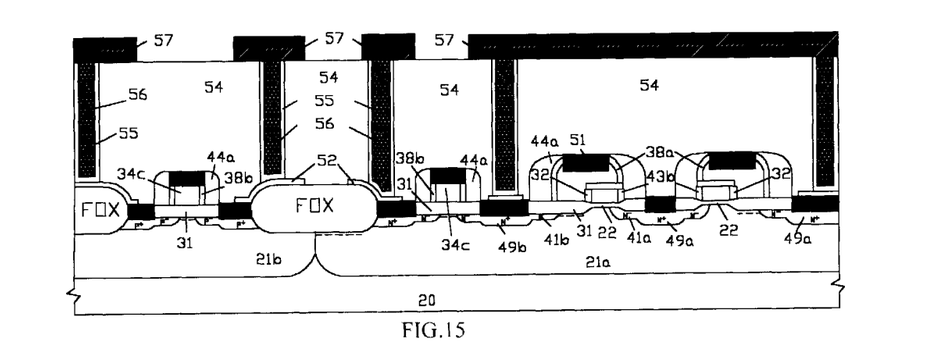

A thick dielectric layer 54 such as borophosphosilicate glass (BPSG) is deposited by plasma-enhanced CVD (PECVD) followed by chemical-mechanical-polishing (CMP) to planarize the whole structure surface. Using the masking photoresist, the contact holes are patterned and etched to remove the thick dielectric layer 54 followed by stripping the masking photoresist. The reflow of the dielectric layer 54 is performed at 850° C. to round up the corners of the etched dielectric layer. A thin titanium-nitride 55 of between about 100 to 200 Angstroms is deposited by sputtering or CVD. This layer is acted as the barrier-metal layer between the upper metal layer and the lower metal layer which connects to the active devices and also provides good adhesion to the silicon-oxide glass and other underlying materials present in the structure. The tungsten layer 56 acted as the metal plugs is deposited by LPCVD using tungsten-fluride reduction in hydrogen at a temperature of between 250° C. to 500° C. to fill the contact holes. Again, the CMP is applied to planarize the structure surface by removing the tungsten and titanium-nitride layers. The M1 metal layer 57 of between about 5000 to 10000 Angstroms in thickness is deposited by sputtering followed by patterning the M1 metal layer using the masking photoresist to form the interconnect of semiconductor devices including flash memory devices, as shown in FIG. 15. The multilevel interconnect can be accomplished by depositing an intermediate dielectric layer followed by CMP, metallization and patterning, and followed by repeating the above processes. At last, the passivation layer is deposited and then the bonding pads are patterned. The titanium metal used in the above description can be replaced by other well-known refractory metals such as tantalum, cobalt and molybdenum etc.; the intermediate dielectric layer can be a CVD silicon-oxide layer or other low-k dielectric layer; the interconnect metal can be aluminum or aluminum alloy or copper.

Figure 16:
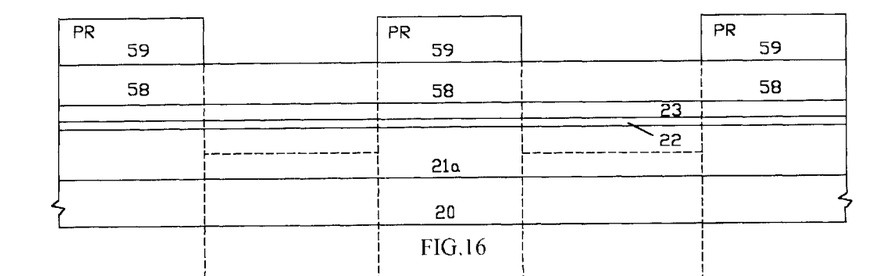
FIGS. 16 through 19 show the schematic cross-sectional views of the process and the structure of shallow-trench-isolation (STI) used for scalable split-gate flash memory device array of the present invention.
Figure 17:
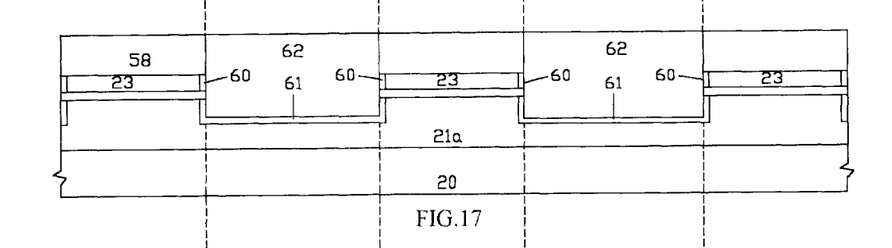
Figure 18:
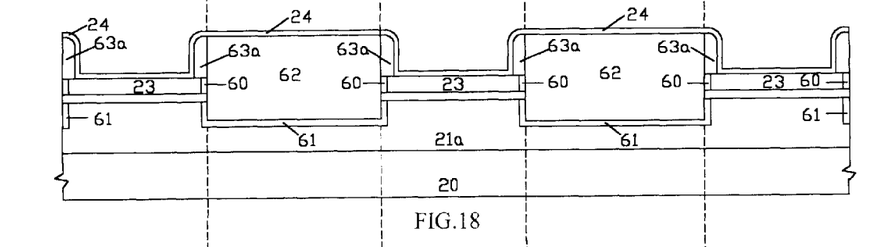
Figure 19:
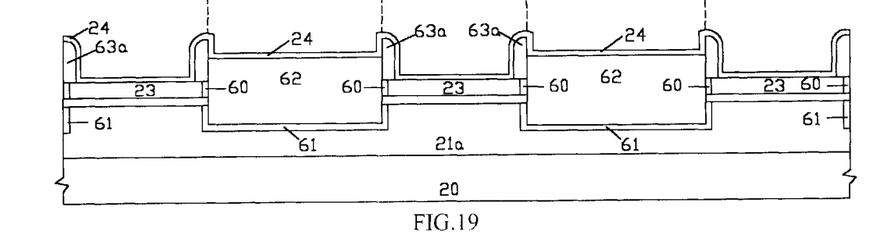

Referring now to FIG. 16 through FIG. 19 there is shown a second embodiment of the present invention. The second embodiment of the present invention includes a method of fabricating a shallow-trench-isolation (STI) for the channel width of scalable split-gate flash memory device array shown in the first embodiment of the present invention. FIG. 16 through FIG. 19 disclose the cross-sectional views of flash memory device array in channel-width direction. Similar to the structure shown in FIG. 3, a first thermal silicon-oxide layer 22 is grown on the p-well 21a formed in a p-doped (100) monocrystalline-silicon substrate 20. A first polycrystalline-silicon layer 23 is deposited on the first thermal silicon-oxide layer 22. A third masking silicon-nitride layer 58 is deposited on the first polycrystalline-silicon layer 22 by LPCVD using dichlorosilane and ammonia reaction at a temperature of approximately 720° C. and the thickness of the third masking silicon-nitride layer 58 is used to control or adjust the coupling ratio of the floating-gate in a flash memory device. The masking photo-resist 59 is patterned to define the width of flash memory devices, as shown in FIG. 16. The third masking silicon-nitride layer 58, the first polycry- stalline-silicon layer 23 and the first thermal silicon-oxide layer 22 are anisotropically etched and the monocrystalline-silicon in the p-well 21a is partially etched to a depth of approximately 0.2 μm. Stripping the masking photoresist 59, the oxidation of the etched first polycrystalline-silicon layer 23 and the etched monocrystalline-silicon in the p-well 21a is performed at a temperature of approximately 850° C. in a dry oxygen ambient. The thickness of the fourth thermal silicon-oxide layer 61 grown on the etched monocrystalline-silicon is about 100 Angstroms and that of the sixth poly-oxide layer 60 grown on the etched first polycrystalline-silicon layer is about 100 Angstroms. The etched trench is refilled with a thick conformable silicon-oxide 62 by a high-density-plasma CVD (HDPCV) system using silane or tetraethoxysilane (TEOS) as the silicon source and the CMP is used to planarize the surface, as shown in FIG. 17. The third masking silicon-nitride layer 58 is then removed by a wet-chemical solution using hot phosphoric acid. A third conformable in-situ doped polycrystalline-silicon layer 63 is deposited by LPCVD using silane decomposition at a temperature of between about 580° C. to 650° C. and the thickness is between about 300 to 500 Angstroms. The third conformable in-situ doped polycrystalline-silicon layer 63 is then anisotropically etched to form the polycrystalline-silicon spacers 63a on the sidewalls of the filling silicon-oxide 62. A first dielectric layer 24 as described in the first embodiment is formed, as shown in FIG. 18, and the following processes are the same as described in a first embodiment for fabricating scalable split-gate flash memory device array and peripheral CMOS devices of the present invention. It should be noted that the polycrystalline-silicon spacers 63a can be used as the double-sides erase cathodes if the dielectric layer 24 is suitably thinner and the planarized filling silicon-oxide 62 is slightly etched by dipping in dilute hydrofluoric acid or etching using anisotropic dry etching before forming the dielectric layer 24, as shown in FIG. 19. Including the embedded double-sides erase cathodes as described, the scalable split-gate flash memory device of the present invention may own the triple-sides erase cathodes for high-speed erasing.

Figure 20:
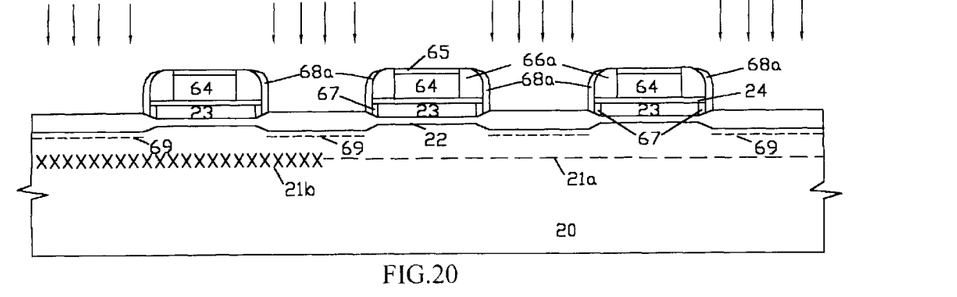
FIGS. 20 through 22 show the schematic cross-sectional views of the process and the structure of modified LOCOS isolation used for scalable split-gate flash memory device array of the present invention.
Figure 21:
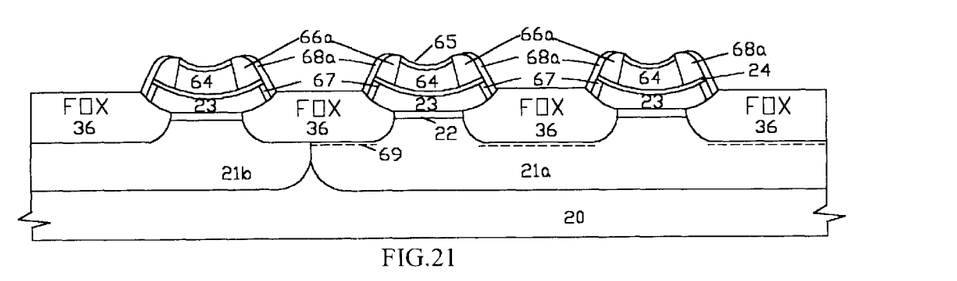
Figure 22:
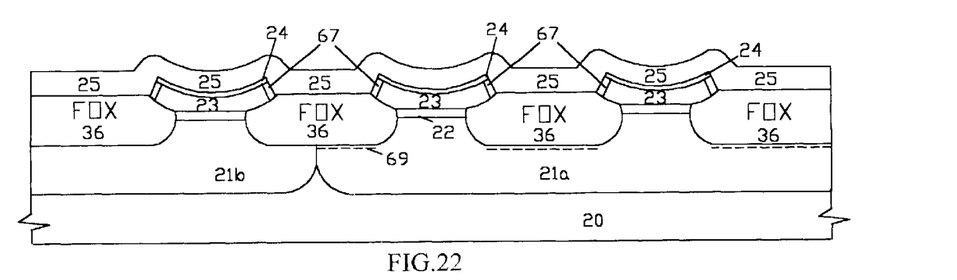

Referring now to FIG. 20 through FIG. 22 there is shown a third embodiment of the present invention. The third embodiment of the present invention includes a method of fabricating a modified LOCOS isolation for the channel width of scalable split-gate flash memory device array as shown in a first embodiment of the present invention. FIG. 20 through FIG. 21 disclose the cross-sectional views of a modified LOCOS isolation structure in channel-width direction. A multilayer oxidation masking structure of the present invention is formed as follows: A first thermal silicon-oxide layer 22 is grown on the p-wells 21a formed in p-doped (100) monocrystalline-silicon substrate 20. A first polycrystalline-silicon layer 23 is deposited on the first thermal silicon-oxide layer 22. A first dielectric layer (ONO layer) 24 is formed on the first polycrystalline-silicon layer 23 followed by depositing a fourth masking silicon-nitride layer 64 and then a first masking silicon-oxide layer 65. The multilayer oxidation masking structure is then patterned by a masking photoresist to define the channel width of flash memory device array followed by selectively etching the first masking silicon-oxide layer 65 and the fourth masking silicon-nitride layer 64, and the masking photoresist is stripped. A second conformable silicon-nitride layer 66 is deposited by LPCVD and is anisotropically etched to form the second silicon-nitride spacers 66a on the sidewalls of the patterned multilayer oxidation masking structure. The first dielectric layer 24 is etched anisotropically using reactive-ion etch in a self-aligned manner followed by removing the first polycrystalline-silicon layer 23. It is clearly seen that the width of the second silicon-nitride spacer 66a is used to define the extended length of the first polycrystalline-silicon layer 23 and further to determine the coupling ratio of the floating gate using the first polycrystalline-silicon layer 23. The oxidation of the sidewalls of the etched first polycrystalline-silicon layer 23 is performed at 850° C. in a dry oxygen ambient to form the seventh thermal poly-oxide layer 67 having a thickness of between about 120 to 200 Angstroms. A third conformable silicon-nitride layer 68 is deposited by LPCVD and is anisotropically etched to form the third silicon-nitride spacers 68a on the sidewalls of the oxidized multilayer oxidation masking structure. It should be noted that the third silicon-nitride spacer is used to shield the tips of the oxidized first polycrystalline-silicon layer from further oxidation during field oxidation. The implant of boron impurities is performed across the first thermal silicon-oxide layer 22 into the semiconductor regions in p-wells to form the channel stop 69 and the dose of implant is between about $10^{13}$ to $10^{14}/cm^2$. The completed multi-layer oxidation masking structure is shown in FIG. 20. The conventional field oxidation is performed in a oxygen and steam ambient at a temperature of between about 950° C. to 1050° C. to form Field-OXide isolation layer 36 marked by FOX, as shown in FIG. 21. It is clearly seen that the field doping encroachment and the bird's beak extension into the active regions designated for fabricating semiconductor devices are reduced by the extended first polycrystalline-silicon layer. The remained fourth masking silicon-nitride layer 64 and the remained second and third silicon-nitride spacers 66a and 68a are removed by using hot phosphoric acid and the remained first silicon-oxide layer 65 is lifted off. A first masking silicon-nitride layer 25 is then deposited by LPCVD. The formed multilayer structure in the channel width direction is shown in FIG. 22, which is the same as that shown in FIG. 3 and the first masking silicon-nitride layer 25 is patterned to fabricate scalable split-gate flash memory device array having a sidewall erase cathode and peripheral CMOS devices in a first embodiment of the present invention. Therefore, the modified LOCOS isolation structure having embedded double-sides erase cathodes and high coupling ratio of a third embodiment of the present invention can be easily incorporated with the scalable split-gate flash memory device array having a sidewall erase cathode of a first embodiment of the present invention to form the scalable split-gate flash memory device array having high coupling ratio and triple-sides erase cathodes for high-speed erasing.

Apparently, the scalable split-gate flash memory device having a sidewall erase cathode of a first embodiment of the present invention incorporating with a shallow-trench-isolation structure having embedded double-sides erase cathodes and adjustable coupling ratio of a second embodiment of the present invention or incorporating with a modified LOCOS isolation structure having embedded double-sides erase cathodes and high coupling ratio of a third embodiment of the present invention forms a scalable split-gate flash memory device having triple-sides erase cathodes for high-density, high-speed, low-voltage and low-power mass storage applications.

The embodiments of FIGS. 3 through 22 used a p-type substrate with retrograde n-wells and retrograde p-wells formed. It should be well understood by those skilled in the art that the opposite doping type may also be used. Furthermore, the split-gate flash memory devices may also be fabricated in an n-well to form p-channel flash memory devices by taking the advantages of the present invention.

While the invention has been particularly shown and described with reference to the preferred embodiments thereof, it will be understood by those skilled in the art that various changes in form and details may be made without departing from the true spirit and scope of the invention.

What is claimed is:

1. A method for simultaneously fabricating scalable split-gate flash memory devices having a sidewall erase cathode and peripheral CMOS devices comprising:

providing a semiconductor substrate with isolations;

forming a multilayer structure of a first thermal silicon-oxide layer, a first polycrystalline-silicon layer, a first dielectric layer and a first masking silicon-nitride layer;

patterning said multilayer structure using a first masking photoresist by selectively removing said first masking silicon-nitride layer, said first dielectric layer and said first polycrystalline-silicon layer, wherein said patterning is used to define the virtual gate length of flash memory devices and said virtual gate length includes two floating-gate lengths and one common source width of a scalable split-gate flash memory device;

oxidizing said patterned multilayer structure to form a first poly-oxide layer on the etched sidewalls of said first polycrystalline-silicon layer and a thicker second thermal silicon-oxide layer over said semiconductor substrate outside said patterned multilayer structure, wherein said first poly-oxide layer is used as the tunneling-oxide layer for erasing the stored charges from said first polycrystalline-silicon layer to the control gate and said thicker second thermal silicon-oxide layer is used as the gate insulator of the control-gate device in said scalable split-gate flash memory device and the gate insulator of said peripheral CMOS devices in peripheral integrated circuits;

implanting doping impurities through said thicker second thermal silicon-oxide layer into said semiconductor substrate to adjust the threshold voltage and the punch-through voltage of said peripheral CMOS devices and the control-gate device in said scalable split-gate flash memory device, wherein two different channel types use a second and a third masking photoresists;

depositing a first conformable polycrystalline-silicon layer followed by anisotropically etching said first conformable polycrystalline-silicon layer to form a first polycrystalline-silicon spacer on the sidewalls of said oxidized and patterned multilayer structure, wherein the width of said first polycrystalline-silicon spacer is mainly controlled by the thickness of said first conformable polycrystalline-silicon layer;

removing said first masking silicon-nitride layer using a wet-chemical solution of hot phosphoric acid;

depositing a second conformable polycrystalline-silicon layer followed by depositing a second masking silicon-nitride layer and then implanting phosphorous impurities into said second conformable polycrystalline-silicon layer, wherein the dose of said implant is between about $10^{15}$ to $5 \times 10^{15}$ Atoms/cm$^2$;

defining the gate lengths of said peripheral CMOS devices using a fourth masking photoresist followed by etching said second masking silicon-nitride layer and anisotropically etching said second conformable polycrystalline-silicon layer to form first polycrystalline-silicon gates for said peripheral CMOS devices and second polycrystalline-silicon spacers on both sides of said first polycrystalline-silicon spacer;

implanting boron impurities through said second thermal silicon-oxide layer into said semiconductor substrate in n-wells in a self-aligned manner to form lightly-doped source and drain diffusion regions of p-channel MOS devices using a fifth masking photoresist, wherein the dose of implant is between about $10^{13}$ to $10^{14}$ Atoms/$cm^2$;

oxidizing said second polycrystalline-silicon spacers and the sidewalls of said first polycrystalline-gates in a dry oxygen or steam ambient to form second thermal poly-oxide layers having a thickness of between about 200 to 300 Angstroms;

etching said first dielectric layer and said first polycrystalline-silicon layer in a self-aligned manner to form common source diffusion windows of said scalable split-gate flash memory devices by using a non-critical sixth masking photoresist to protect the non-etching area;

implanting phosphorous impurities through said second thermal silicon-oxide layer and said first thermal silicon-oxide layer into said semiconductor substrate in p-wells in a self-aligned manner to form lightly-doped source and drain diffusion regions of n-channel MOS devices, lightly-doped source and drain diffusion regions of said scalable split-gate flash memory devices by using a seventh masking photoresist, wherein the dose of the implant is between about $10^{13}$ to $10^{14}$ Atoms/$cm^2$;

removing said second masking silicon-nitride layer on said first polycrystalline-silicon gates of said peripheral CMOS devices using dry etch followed by oxidizing said first polycrystalline-silicon gates and the sidewalls of said etched first polycrystalline-silicon layer to form third thermal poly-oxide layers;

depositing a first conformable silicon-nitride layer followed by anisotropically etching said first conformable silicon-nitride layer to form first silicon-nitride spacers on the sidewalls of said scalable split-gate flash memory devices and the sidewalls of said peripheral CMOS devices;

implanting boron impurities across said second thermal silicon-oxide layer into said semiconductor substrate in said n-wells to form heavily-doped source and drain diffusion regions of said p-channel MOS devices using a eighth masking photoresist, wherein the dose of implant is between about $10^{15}$ to $5 \times 10^{15}$ Atoms/$cm^2$;

removing the field oxide of isolation and said first thermal silicon-oxide layer over the lightly-doped source diffusion regions of said scalable split-gate flash memory array using a non-critical ninth masking photoresist to form common buried source windows in a self-aligned manner using buffered hydrofluoric acid followed by oxidizing the exposed semiconductor surface to form a third thermal silicon-oxide layer having a thickness of approximately 100 Angstroms;

implanting arsenic impurities across said second and third thermal silicon-oxide layers into the semiconductor regions in said p-wells in a self-aligned manner to form heavily-doped source and drain diffusion regions of said n-channel MOS devices and heavily-doped drain and common-buried source diffusion regions of said scalable split-gate flash memory array using a tenth masking photoresist;

performing a thermal annealing to activate implanted doping impurities and to eliminate implant-induced defects;

removing said second and third thermal silicon-oxide layers over said heavily-doped source and drain diffusion regions of all devices, said third poly-oxide layers over said first polycrystalline-silicon gates of said peripheral CMOS devices, and said second poly-oxide over said second polycrystalline-silicon spacers of said scalable split-gate flash memory devices using dilute hydrofluoric acid or buffered hydrofluoric acid or anisotropic dry etch;

sputtering a titanium metal layer over all the structure surface followed by annealing in a nitrogen ambient to form a titanium-disilicide layer over exposed monocrystalline and polycrystalline silicon regions and a first titanium-nitride layer over all the structure surface;

patterning the contact regions for inter-metal interconnect using an eleventh masking photoresist by selectively etching said first titanium-nitride layers using a $NH_4OH:H_2O_2:H_2O$ (1:1:5) solution followed by heating in an argon ambient to reduce the resistivities of said first titanium-nitride layer and said titanium-disilicide layer;

depositing a thick dielectric layer using low-temperature CVD system followed by chemical-mechanical polishing to planarize all the structure surface, wherein said thick dielectric layer is made of CVD silicon-oxide or borophosphosilicate glass;

patterning said thick dielectric layer using a twelfth masking photoresist to form contact holes followed by reflowing said contact holes to round up the corners;

depositing a second titanium-nitride layer known as the barrier metal and a tungsten layer known as the plug metal followed by chemical-mechanical-polishing to planarize the whole structure surface by removing said second titanium-nitride and said tungsten layer on the flat surface of said thick dielectric layer;

depositing a M1 metal layer followed by patterning said M1 metal layer using a thirteenth masking photoresist to form a M1 metal interconnect known as a first-level M1 metal interconnect;

depositing a first intermediate dielectric layer over said first-level M1 metal interconnect followed by CMP, first via patterning using a fourteenth masking photoresist and etching, the barrier metal deposition and the plug metal deposition, CMP, a M2 metal layer deposition and patterning using a fifteenth masking photoresist to form a second-level M2 metal interconnect;

repeating the above processes to form an N-level MN metal interconnect, wherein said N-level MN metal can be aluminum, aluminum alloy or copper; said intermediate dielectric layer can be a CVD oxide layer or low dielectric-constant dielectric layer; said titanium metal can be replaced by cobalt or tantalum or molybdenum etc.; said tungsten plug can be replaced by aluminum;

depositing a thick passivation layer followed by patterning said thick passivation layer using a sixteenth masking photoresist to open the bonding pads, wherein said thick passivation layer is made of phosphorous-doped glass and/or silicon-nitride layer.

2. The method of claim 1 wherein said semiconductor substrate is p-type with retrograde n-wells and retrograde p-wells formed and said scalable split-gate flash memory devices are fabricated in a p-well.

3. The method of claim 1 wherein said first thermal silicon-oxide layer is used as a tunneling-oxide layer for hot-electron injection and is between about 85 to 110 Angstroms in thickness.

4. The method of claim 1 wherein said first thermal poly-oxide layer is used as a tunneling-oxide layer for erasing the stored charges in said first polycrystalline-silicon layer to said control gate and is between about 150 to 220 Angstroms in thickness.

5. The method of claim 1 wherein said first polycrystalline-silicon layer is used as a floating gate of said scalable split-gate flash memory devices and the sidewall of said first polycrystalline-silicon layer is acted as the erase cathode, wherein said first polycrystalline-silicon layer is between about 300 to 600 Angstroms and is in-situ doped by phosphorous impurities having a concentration of between about $10^{18}$ to $5 \times 10^{19}$ Atoms/cm$^3$.

6. The method of claim 1 wherein said second thermal silicon-oxide layer is used as a gate insulator of control-gate devices in said scalable split-gate flash memory devices and said peripheral CMOS devices and is between about 200 to 400 Angstroms in thickness.

7. The method of claim 1 wherein said first conformable polycrystalline-silicon layer is in-situ doped with phosphorous impurities having a concentration of between about $10^{18}$ to $5 \times 10^{19}$ Atoms/cm$^3$ and the thickness is between about 300 to 1500 Angstroms.

8. The method of claim 1 wherein said second conformable polycrystalline-silicon layer is in-situ doped with phosphorous impurities having a concentration of between about $10^{18}$ to $5 \times 10^{19}$ Atoms/cm$^3$ and the thickness is between about 500 to 2000 Angstroms.

9. The method of claim 1 wherein said first polycrystalline-silicon spacer plus said second polycrystalline-silicon spacer forms the gate length of control-gate devices and said second polycrystalline-silicon spacer forms the gate length of floating-gate devices, wherein the whole gate length of said scalable split-gate flash memory device is mainly controlled by the deposited thicknesses of said first and second conformable polycrystalline-silicon layers.

10. The method of claim 1 wherein said first dielectric layer is a silicon oxide-silicon nitride-silicon oxide (ONO) layer or a thermal poly-oxide layer having an equivalent silicon-oxide thickness of between about 150 to 220 Angstroms.

11. The method of claim 1 wherein said first silicon-nitride spacer is formed by anisotropically etching said first conformable silicon-nitride layer having a thickness of between about 500 to 1000 Angstroms.

12. The method of claim 1 wherein said first masking silicon-nitride layer is between about 1000 to 2000 Angstroms in thickness and said second masking silicon-nitride layer is between about 500 to 1000 Angstroms in thickness.

13. The method of claim 1 wherein said third thermal poly-oxide layer formed on said first polycrystalline-silicon gates and the sidewalls of said first polycrystalline-silicon layer is between about 100 to 150 Angstroms in thickness.

14. The method of claim 1 wherein said scalable split-gate flash memory device having a sidewall erase cathode is fabricated in a retrograde p-well with the device width isolated by any possible isolation technique.

15. The method of claim 1 wherein said scalable split-gate flash memory device having a sidewall erase cathode is a p-channel device and is fabricated in a retrograde n-well formed in a n-type substrate.

16. The method of claim 1 wherein said isolations are fabricated by shallow trench isolation for the width of a scalable split-gate flash memory array having adjustable coupling ratio and embedded double-sides erase cathodes comprising:

providing said semiconductor substrate;

forming a multilayer structure of said first thermal silicon-oxide layer, said first polycrystalline-silicon layer and a third masking silicon-nitride layer;

patterning said multilayer structure using a seventeenth masking photoresist to define the channel width of said split-gate flash memory device and etched trenches by selectively removing said third masking silicon-nitride layer, said first polycrystalline-silicon layer, said first thermal silicon-oxide layer and said semiconductor substrate to a depth of between about 1000 to 3000 Angstroms;

oxidizing the etched sidewalls of said first polycrystalline-silicon layer and the etched surface of said semiconductor substrate to form a poly-oxide layer and a thermal silicon-oxide layer having a thickness of between about 50 to 200 Angstroms;

depositing a thick silicon-oxide film on said oxidized multilayer structure to fill said etched trenches using high-density plasma (HDP) CVD;

planarizing the structure surface using chemical-mechanical-polishing (CMP) to remove said filled excess silicon-oxide film over said third masking silicon-nitride layer;

removing said third masking silicon-nitride layer using a wet-chemical solution of hot phosphoric acid; and depositing a third conformable polycrystalline-silicon layer followed by anisotropically etching said third conformable polycrystalline-silicon layer to form the third polycrystalline-silicon spacers on the sidewalls of said planarized silicon-oxide layer.

17. The method of claim 16 wherein the thickness of said third masking silicon-nitride layer can be used to adjust the height of said third polycrystalline-silicon spacers which determine the coupling ratio of said non-volatile semiconductor memory device array.

18. The method of claim 16 wherein said third conformable polycrystalline-silicon layer is in-situ doped with phosphorous impurities having a concentration of between about $10^{18}$ to $5 \times 10^{19}$ Atoms/cm$^3$ and the thickness is between about 300 to 500 Angstroms.

19. The method of claim 16 and further comprising the formation of a first dielectric layer such as a ONO layer or a thermal poly-oxide layer followed by fabricating said non-volatile semiconductor memory device array of any possible device structure using said shallow-trench-isolation structure.

20. The method of claim 16 and further comprising the formation of said first dielectric layer followed by depositing said first masking silicon-nitride layer to form said multilayer structure as stated in claim 1 whereby the simultaneous fabrication of said scalable split-gate flash memory device array having a sidewall erase cathode and said peripheral CMOS devices is followed.

21. The method of claim 16 and further comprising the selective etching of said planarized silicon-oxide layer to a depth of between about 100 to 200 Angstroms to form the polycrystalline-silicon tips which are acted as embedded double-sides erase cathodes followed by forming said thinner first dielectric layer and then depositing said first masking silicon-nitride layer to form said multilayer structure as stated in claim 1 whereby the simultaneous fabrication of said scalable split-gate flash memory device array having a sidewall erase cathode and said peripheral CMOS devices is followed to implement said scalable split-gate flash memory device array having triple-sides erase cathodes.

22. The method of claim 21 wherein said thinner first dielectric layer is a ONO layer or a thermal poly-oxide layer having an equivalent silicon-oxide thickness of between 100 to 150 Angstroms.

23. The method of claim 1 wherein said isolations are fabricated by modified LOCOS isolation for the width of a scalable split-gate flash memory array having high coupling ratio and embedded double-sides erase cathodes comprising:

providing said semiconductor substrate;

forming a multilayer oxidation masking structure of said first thermal silicon-oxide layer, said first polycrystalline-silicon layer, said first dielectric layer, a fourth masking silicon-nitride layer and a first masking silicon-oxide layer;

patterning said multilayer oxidation masking structure using an eighteenth masking photoresist by selectively removing said first masking silicon-oxide layer and said fourth masking silicon-nitride layer;

forming a second silicon-nitride spacer on the exposed sidewalls of said patterned multilayer oxidation masking structure by depositing a second conformable silicon-nitride layer over said patterned multilayer oxidation masking structure and anisotropically etching said second conformable silicon-nitride layer;

etching said patterned multilayer oxidation masking structure having said second silicon-nitride spacers in a self-aligned manner by removing said first dielectric layer and said first polycrystalline-silicon layer, wherein said first polycrystalline-silicon layer is acted as a buffer layer for stress relief during field oxidation and is also used as the floating gate of said scalable split-gate flash memory array;

oxidizing the exposed sidewalls of said etched first polycrystalline-silicon layer to form a seventh thermal poly-oxide layer, wherein said seventh thermal poly-oxide layer becomes a tunneling-oxide layer of said embedded double-sides erase cathodes;

forming a third silicon-nitride spacer on said oxidized sidewalks of said etched first polycrystalline-silicon layer by depositing a third conformable silicon-nitride layer over said oxidized patterned multiplayer oxidation masking structure followed by anisotropically etching said third conformable silicon-nitride layer, wherein said third silicon-nitride spacer formed is used to shield the extended first polycrystalline-silicon from oxidation during field oxidation and also to reduce the bird's beak extension and field doping enchroachment into the active regions of said scalable split-gate flash memory array;

implanting doping impurities into designated semiconductor regions for a field-oxide isolation structure in a self-aligned manner to form a channel stop;

performing a conventional field oxidation step to form said field-oxide isolation structure whereby said field oxidation step is accomplished in an oxygen and steam ambient; and removing said remained fourth masking silicon-nitride layer and said second and third silicon-nitride spacers by a wet chemical solution using hot phosphoric acid followed by depositing a first masking silicon-nitride layer to form said multilayer structure as stated in claim 1, wherein said first masking silicon-oxide layer over said fourth masking silicon-nitride layer is lifted off.

24. The method of claim 23 wherein said second silicon-nitride spacer is used to define the extended length of said first polycrystalline-silicon layer and further to determine the coupling ratio of a floating gate in said non-volatile semiconductor memory device array and said extended length of said first polycrystalline-silicon layer forms the tips of said embedded double-sides erase cathodes.

25. The method of claim 23 wherein said seventh thermal poly-oxide layer grown on said tips of said extended length of said first polycrystalline-silicon layer is between about 120 to 200 Angstroms in thickness and is used as a tunneling-oxide layer of said embedded double-sides erase cathodes.

26. The method of claim 23 wherein said first dielectric layer is a ONO layer having an equivalent silicon-oxide thickness of between about 150 to 220 Angstroms.

27. The method of claim 23 wherein said first polycrystalline-silicon layer is in-situ doped with phosphorous impurities having a concentration of between about $10^{18}$ to $5\times10^{19}$ Atoms/cm$^3$ and is between about 300 to 600 Angstroms in thickness.

28. The method of claim 24 wherein said first thermal silicon-oxide layer is between about 85 to 110 Angstroms in thickness and is acted as a tunneling-oxide layer for hot-electrons generated in the semiconductor regions.

29. The method of claim 23 and further comprising the simultaneous fabrication of said scalable split-gate flash memory device array having said sidewall erase cathode and said peripheral CMOS devices as stated in claim 1 to form said scalable split-gate flash memory device array and system having triple-sides erase cathodes.

30. The method of claim 23 and further comprising the fabrication of said non-volatile semiconductor memory device array of any possible device structure isolated by said modified LOCOS isolation structure having said double-sides erase cathodes to form said non-volatile semiconductor memory device array and system.

* * * * *